United States Patent
Oki et al.

(10) Patent No.: US 10,215,512 B2
(45) Date of Patent: Feb. 26, 2019

(54) HEAT SPREADER AND METHOD FOR MANUFACTURING THE SAME

(71) Applicant: A.L.M.T. Corp., Tokyo (JP)

(72) Inventors: Hiroaki Oki, Sakata (JP); Tadashi Arikawa, Toyama (JP); Shouichi Inaba, Sakata (JP)

(73) Assignee: A.L.M.T. Corp., Tokyo (JP)

(*) Notice: Subject to any disclaimer, the term of this patent is extended or adjusted under 35 U.S.C. 154(b) by 0 days.

(21) Appl. No.: 15/312,931

(22) PCT Filed: May 13, 2015

(86) PCT No.: PCT/JP2015/063811
§ 371 (c)(1),
(2) Date: Nov. 21, 2016

(87) PCT Pub. No.: WO2015/182385
PCT Pub. Date: Dec. 3, 2015

(65) Prior Publication Data
US 2017/0198991 A1    Jul. 13, 2017

(30) Foreign Application Priority Data
May 29, 2014   (JP) ................. 2014-111428

(51) Int. Cl.
*B32B 15/20* (2006.01)
*F28F 21/08* (2006.01)
(Continued)

(52) U.S. Cl.
CPC ............ *F28F 21/085* (2013.01); *B32B 3/263* (2013.01); *B32B 15/01* (2013.01); *B32B 15/20* (2013.01);
(Continued)

(58) Field of Classification Search
None
See application file for complete search history.

(56) References Cited

U.S. PATENT DOCUMENTS

| 5,493,153 A | 2/1996 | Arikawa et al. |
| 6,926,861 B2 * | 8/2005 | Hirayama ................ B22F 3/02 257/E23.112 |

(Continued)

FOREIGN PATENT DOCUMENTS

| CN | 102284701 A | 12/2011 | |
| CN | 102941702 | * 2/2013 | ................ B22F 3/11 |

(Continued)

OTHER PUBLICATIONS

Notice of Grounds of Rejection in counterpart Japanese Patent Application No. 2015-545219, dated Jul. 14, 2016.
(Continued)

*Primary Examiner* — Seth Dumbris
(74) *Attorney, Agent, or Firm* — Venable LLP; Michael A. Sartori; Laura G. Remus

(57) ABSTRACT

[Problem] To provide a heat spreader capable of removing heat from an element more efficiently and immediately than an existing one, and also capable of satisfactorily responding to further enhancement in performance and output of various apparatuses, and a method for efficiently manufacturing the same. [Solution] A heat spreader includes a Cu—Mo layer made of a Cu—Mo composite material and having an average thickness of less than or equal to 0.6 mm and a variation in thickness of less than or equal to 0.1 mm, and a Cu layer directly stacked on each of both surfaces thereof. A method for manufacturing the heat spreader includes planarizing a plate material of the Cu—Mo composite (Continued)

material constituting the Cu—Mo layer, and roll-bonding a Cu plate constituting the Cu layer to each of both surfaces thereof.

6 Claims, 1 Drawing Sheet

(51) Int. Cl.
*B32B 15/01* (2006.01)
*H01L 23/373* (2006.01)
*B32B 3/26* (2006.01)
*B32B 37/10* (2006.01)
*F28F 13/00* (2006.01)
*B22F 3/10* (2006.01)
*B22F 7/06* (2006.01)
*C22C 9/00* (2006.01)
*C22C 27/04* (2006.01)

(52) U.S. Cl.
CPC .............. *B32B 37/10* (2013.01); *F28F 13/00* (2013.01); *F28F 21/081* (2013.01); *H01L 23/373* (2013.01); *H01L 23/3735* (2013.01); *H01L 23/3736* (2013.01); *B22F 3/10* (2013.01); *B22F 7/06* (2013.01); *B32B 2250/03* (2013.01); *B32B 2307/302* (2013.01); *B32B 2311/12* (2013.01); *B32B 2457/14* (2013.01); *C22C 9/00* (2013.01); *C22C 27/04* (2013.01); *H01L 2924/0002* (2013.01)

(56) References Cited

U.S. PATENT DOCUMENTS

| 2001/0038140 A1 | 11/2001 | Karker et al. |
| 2008/0298024 A1 | 12/2008 | Takashima et al. |
| 2010/0206537 A1 | 8/2010 | Ikeda et al. |

FOREIGN PATENT DOCUMENTS

| CN | 102941702 A | 2/2013 | | |
| JP | H06-268117 A | 9/1994 | | |
| JP | H06-316707 A | 11/1994 | | |
| JP | 11-297909 | * 10/1999 | ........... | H01L 23/373 |
| JP | H11-297909 A | 10/1999 | | |
| JP | 2001-358226 A | 12/2001 | | |
| JP | 2004-281676 A | 10/2004 | | |
| JP | 2007/142126 A | 6/2007 | | |
| JP | 2007142126 | * 6/2007 | ........... | H01L 23/373 |
| JP | 2008-300450 A | 12/2008 | | |
| JP | 2009-010340 A | 1/2009 | | |
| JP | 2009-238805 A | 10/2009 | | |
| JP | 2010-062310 A | 3/2010 | | |
| WO | 2009/098865 A1 | 8/2009 | | |

OTHER PUBLICATIONS

International Search Report in counterpart International Applicaiton No. PCT/JP2015/063811, dated Jul. 21, 2015.
Extended European Search Report in counterpart European Patent Application No. 15798992.2, dated Jan. 17, 2018.
Notification of the First Office Action issued in counterpart Chinese Patent Application No. 201580028494.7 dated Apr. 24, 2018.

* cited by examiner

HEAT SPREADER AND METHOD FOR MANUFACTURING THE SAME

TECHNICAL FIELD

The present invention relates to a heat spreader for removing heat as efficiently as possible from an element which generates a large heat during operation in particular, and a method for manufacturing the same.

BACKGROUND ART

Removing heat as efficiently and immediately as possible is required for an element which generates a large heat during operation, such as a power semiconductor element used for drive control of an electric vehicle, a hybrid vehicle, or the like, a light emitting element such as a laser diode, a control element for a base station for mobile phones and the like, an image display element for a plasma display panel or the like, or a microprocessor unit for a computer.

This is because, if the generated heat is not removed efficiently and immediately, the element itself may overheat and malfunction (thermally run away), or the element, a package which covers the element, or the like may be broken.

In recent years, with enhancement in performance and output of various apparatuses using these elements, a shift from elements commonly used at present, such as silicon (Si)-based, gallium arsenide (GaAs)-based, and indium phosphide (InP)-based elements, to elements such as silicon carbide (SiC)-based and gallium nitride (GaN)-based elements is under consideration.

In that case, it is possible to increase the operable temperature of an element, for example, from around 120° C. for the silicon-based element and the like to around 200° C. for the silicon carbide-based element and the like, and it is considered that malfunction, breakage, and the like due to overheating are less likely to occur than before.

However, even when these elements are used, it is still required to remove heat from these elements as efficiently and immediately as possible.

In order to remove heat from an element efficiently and immediately, it is common to use a heat spreader formed in the shape of, for example, a plate as a whole, and having one surface (element mounting surface) to which an element is solder-bonded directly or with a ceramic substrate or the like interposed therebetween, and an opposite surface (heat dissipating surface) to which a cooling mechanism such as a cooler is connected.

Conventionally, heat spreaders formed integrally as a whole using a metal such as copper (Cu) or aluminum (Al) or an alloy have been used. Recently, however, using a heat spreader including a copper-molybdenum (Cu—Mo) layer made of a Cu—Mo composite material, which has a thermal expansion coefficient close to that of an element such as the Si-based, GaAs-based, InP-based, SiC-based, and GaN-based element described above, that of a ceramic substrate made of aluminium nitride (AlN), aluminium oxide ($Al_2O_3$), or silicon nitride ($Si_3N_4$), or the like, is under consideration.

By providing the Cu—Mo layer, the thermal expansion coefficient of the heat spreader can be decreased to be less than that of a conventional heat spreader entirely made of a metal or an alloy, and can be brought closer to the thermal expansion coefficient of the element or the ceramic substrate as much as possible. That is, matching between the thermal expansion coefficients thereof can be achieved.

This can prevent an excessive stress from being applied to the element or the ceramic substrate (hereinafter may be abbreviated as an "element or the like") based on the difference in thermal expansion coefficient, under a thermal load environment such as a hot-cold cycle which repeats heat generation due to operation of the element and cooling after stop thereof, and breaking the element or the like, the aforementioned package, or the like, or damaging solder bonding between the heat spreader and the element or the like.

Examples of the Cu—Mo composite material constituting the Cu—Mo layer include:

(i) a Cu—Mo composite material prepared by heating a mixture of molybdenum (Mo) powder and Cu powder to the melting point of Cu or higher to melt the Cu and infiltrate the melted Cu into between Mo powder particles, and thereafter cooling and integrating them; and (ii) a Cu—Mo composite material prepared by sintering Mo powder beforehand to fabricate a porous body (skeleton), infiltrating Cu into pores of such a porous body, and thereafter cooling and integrating them.

It should be noted that Cu is used together with Mo because the heat conductivity of Mo alone is insufficient and thus Cu is additionally used to prevent a decrease in the heat conductivity of the heat spreader.

As a heat spreader including such a Cu—Mo layer, a heat spreader made of a stacked body having a Cu layer stacked on each of both surfaces of the Cu—Mo layer has been proposed (see PTDs 1 to 3 and the like).

In order to satisfactorily solder-bond an element or the like to an element mounting surface of a plate-shaped heat spreader without generating voids and the like which interfere with heat conduction, it is preferable to form beforehand, on the element mounting surface, a nickel plating layer excellent in solder wettability and affinity.

However, since Cu and Mo, which are plated under significantly different conditions, are exposed in a surface of the Cu—Mo layer made of a Cu—Mo composite body, it is difficult to form a stable nickel plating layer directly on such a surface.

In contrast, since the heat spreader having a stacked structure described above has an element mounting surface made of Cu alone, a stable nickel plating layer can be formed thereon, and an element or the like can be satisfactorily solder-bonded on such a nickel plating layer without generating voids and the like which interfere with heat conduction. Further, since the Cu layer is excellent in solder wettability and affinity, it is also possible to omit a nickel plating layer.

CITATION LIST

Patent Document

PTD 1: Japanese Patent Laying-Open No. 06-316707
PTD 2: Japanese Patent Laying-Open No. 2001-358226
PTD 3: Japanese Patent Laying-Open No. 2007-142126

SUMMARY OF INVENTION

Technical Problem

At present, however, it is becoming impossible for the conventional heat spreader having a stacked structure described above to efficiently and immediately remove heat from an element increasing with further enhancement in performance and output of various apparatuses.

One object of the present invention is to provide a heat spreader capable of removing heat from an element more efficiently and immediately than an existing one, and also capable of satisfactorily responding to further enhancement in performance and output of various apparatuses, and a method for efficiently manufacturing the same.

Solution to Problem

The present invention is directed to a heat spreader, including a Cu—Mo layer made of a Cu—Mo composite material and having an average thickness of less than or equal to 0.6 mm and a variation in thickness of less than or equal to 0.1 mm, and a Cu layer directly stacked on each of both surfaces of the Cu—Mo layer.

Further, the present invention is directed to a method for manufacturing the heat spreader of the present invention, including the steps of planarizing a plate material of the Cu—Mo composite material constituting the Cu—Mo layer, and directly roll-bonding a Cu plate constituting the Cu layer to each of both surfaces of the planarized plate material.

Advantageous Effects of Invention

According to the present invention, by setting the average thickness of the Cu—Mo layer with a small heat conductivity, of the heat spreader having a stacked structure, to less than or equal to 0.6 mm, the heat conductivity of the heat spreader in a thickness direction can be improved more than that of an existing one, and heat from an element can be removed further efficiently and immediately. In addition, by suppressing the variation in the thickness of the Cu—Mo layer to less than or equal to 0.1 mm to minimize the variation, local reduction in heat conductivity and local generation of thermal stress can be suppressed. Therefore, a heat spreader capable of removing heat from an element more efficiently and immediately than an existing one, and also capable of satisfactorily responding to further enhancement in performance and output of various apparatuses can be provided.

Further, according to the manufacturing method of the present invention, merely by adding the step of planarizing beforehand a plate material of the Cu—Mo composite material constituting the Cu—Mo layer prior to roll-bonding a Cu plate constituting the Cu layer to each of front and rear surfaces of the plate material, the heat spreader of the present invention having excellent characteristics as described above can be manufactured efficiently with high productivity.

DESCRIPTION OF EMBODIMENTS

<<Heat Spreader>>

Figure 1:
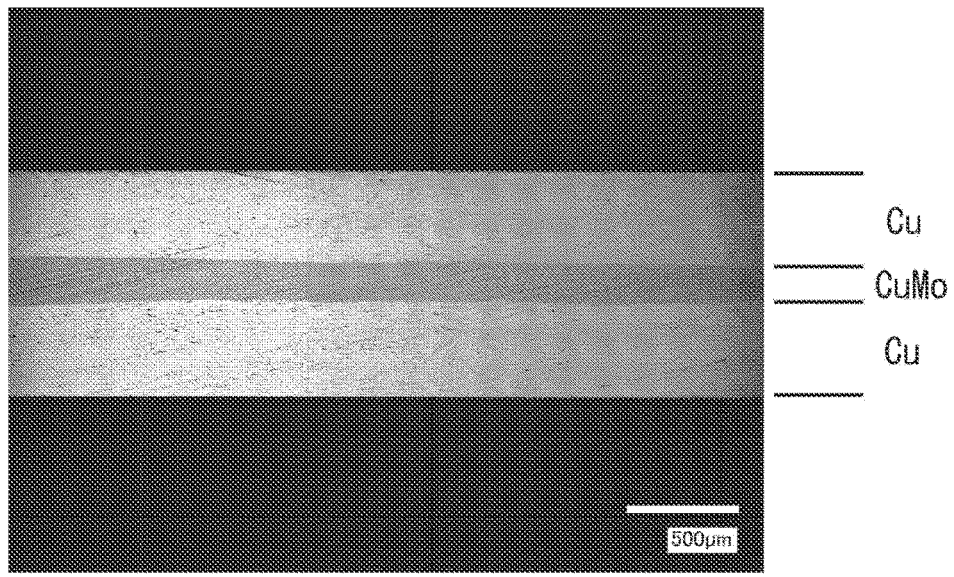
FIG. 1 is a micrograph showing a magnified cross section of a heat spreader manufactured in an example of the present invention.

A heat spreader of the present invention is characterized by including a Cu—Mo layer made of a Cu—Mo composite material and having an average thickness of less than or equal to 0.6 mm and a variation in thickness of less than or equal to 0.1 mm, and a Cu layer directly stacked on each of both surfaces of the Cu—Mo layer.

When the average thickness of the Cu—Mo layer with a small heat conductivity, of the heat spreader having a stacked structure, is set to less than or equal to 0.6 mm, which is smaller than the range described for example in PTDs 1 to 3, the heat conductivity of the heat spreader in a thickness direction can be improved more than that of an existing one.

Accordingly, the heat spreader can remove heat from an element more efficiently and immediately than an existing one, and can satisfactorily respond to further enhancement in performance and output of various apparatuses. In addition, a cooling mechanism connected to a heat dissipating surface of the heat spreader can be downsized when compared with a conventional one, and the entire semiconductor device including the heat spreader, the cooling mechanism, the element, and the like can be downsized when compared with a conventional one.

However, the inventors have found through their study that a mere decrease in the thickness of the Cu—Mo layer may cause the following problems:

(1) heat cannot be removed uniformly and immediately at an entire bonding surface of the element bonded to an element mounting surface of the heat spreader; and (2) Under a thermal load environment such as the hot-cold cycle described above, an excessive stress is applied to the element or the like bonded to the element mounting surface, which tends to break the element or the like, a package, or the like, or to damage bonding.

Therefore, the inventors have continued their study and found that a mere decrease in the thickness of the Cu—Mo layer causes an increased variation in the thickness of the Cu—Mo layer, which leads to these problems.

Specifically, when the Cu—Mo layer with a small average thickness has an increased variation in thickness as described above, or when the Cu—Mo layer has an excessively increased variation in thickness and thereby becomes discontinuous, the heat conductivity of the heat spreader in the thickness direction varies in a plane direction, and the heat conductivity is locally decreased at some locations. As a result, the above problem (1) is likely to occur.

In addition, the Cu—Mo layer functions to decrease the thermal expansion coefficient of the entire heat spreader in the heat spreader having a stacked structure, as described above. However, when such a Cu—Mo layer has an increased variation in thickness, or when the Cu—Mo layer has an excessively increased variation in thickness and thereby becomes discontinuous, the thermal expansion coefficient of the heat spreader varies in the plane direction, and the thermal expansion coefficient is locally increased at some locations. As a result, the above problem (2) is likely to occur.

In contrast, according to the study by the inventors, the above problems (1) and (2) can both be solved by suppressing the variation in the thickness of the Cu—Mo layer, which has an average thickness of less than or equal to 0.6 mm, to less than or equal to 0.1 mm, as described above.

Specifically, according to the present invention, by setting the average thickness of the Cu—Mo layer to less than or equal to 0.6 mm, the heat conductivity in the thickness direction can be improved more than that of an existing one, and heat from an element can be removed further efficiently and immediately. In addition, by suppressing the variation in the thickness of the Cu—Mo layer to less than or equal to 0.1 mm, the variation is minimized and the Cu—Mo layer is prevented from becoming discontinuous. Thereby, a heat spreader free from the above problem (1) due to the varying heat conductivity and the above problem (2) due to the varying thermal expansion coefficient can be provided.

As with a conventional one, examples of the Cu—Mo composite material constituting the Cu—Mo layer include:

(i) a Cu—Mo composite material prepared by heating a mixture of Mo powder and Cu powder to the melting point of Cu or higher to melt the Cu and infiltrate the melted Cu into between Mo powder particles, and thereafter cooling and integrating them; and (ii) a Cu—Mo composite material prepared by sintering Mo powder beforehand to fabricate a porous body (skeleton), infiltrating Cu into pores of such a porous body, and thereafter cooling and integrating them.

Further, the Cu layer can be formed of any Cu material. However, in view of imparting a high heat conductivity to the heat spreader, the Cu layer is preferably formed of, for example, highly pure copper having a purity of 99.96% or more, oxygen-free copper, or the like.

<Average Thickness and Variation in Thickness of Cu—Mo Composite Material>

The reason why the average thickness of the Cu—Mo layer made of the Cu—Mo composite material described above is limited to less than or equal to 0.6 mm in the present invention is that, if the thickness is more than this range, it is not possible to achieve the effect of improving the heat conductivity of the heat spreader in the thickness direction more than that of an existing one, and removing heat from an element further efficiently and immediately.

In addition, the reason why the variation in the thickness of the Cu—Mo layer described above is limited to less than or equal to 0.1 mm in the present invention is that, if the variation in thickness is more than this range or the Cu—Mo layer becomes discontinuous, the heat conductivity of the heat spreader in the thickness direction varies in the plane direction and thereby the above problem (1) is likely to occur, or the thermal expansion coefficient of the heat spreader varies in the plane direction and thereby the above problem (2) is likely to occur.

It should be noted that the average thickness of the Cu—Mo layer is preferably more than or equal to 0.12 mm in the above range.

If the average thickness of the Cu—Mo layer is less than this range, even though the variation in thickness is set to less than or equal to 0.1 mm, the Cu—Mo layer is likely to have an increased variation in relative thickness, or to have an excessively increased variation in thickness and thereby become discontinuous. In that case, the above problems (1) and (2) may be likely to occur.

Further, as described above, the Cu—Mo layer is a layer in the heat spreader having a stacked structure that functions to decrease the thermal expansion coefficient of the entire heat spreader. However, if the average thickness of the Cu—Mo layer is less than the above range, such a function is not fully exhibited, and the thermal expansion coefficient of the entire heat spreader is increased on the contrary. Accordingly, there is a possibility that, under a thermal load environment, an excessive stress is applied to the element or the like bonded to the element mounting surface, which tends to break the element or the like, the package, or the like, or to damage bonding.

On the other hand, the variation in the thickness of the Cu—Mo layer is preferably less than or equal to 0.06 mm in the aforementioned range, in view of further effectively preventing occurrence of the above problems (1) and (2).

However, the variation in the thickness of the Cu—Mo layer is preferably more than or equal to 0.03 mm in the above range.

In order to set the variation in thickness to less than 0.03 mm, it is necessary to planarize a plate material of the Cu—Mo composite material constituting the Cu—Mo layer until the plate material reaches a state having a high flatness enough to meet such a condition. However, it is substantially difficult to planarize the plate material of the Cu—Mo composite material made of Cu and Mo, which are two materials completely different in hardness and workability, until the plate material reaches the above state.

In order to set the average thickness of the Cu—Mo layer to the above range, it is only necessary to adjust, for example, the average thickness of the planarized plate material of the Cu—Mo composite material constituting the Cu—Mo layer, the thickness of a Cu plate constituting the Cu layer, rolling conditions under which the plate material of the Cu—Mo composite material and the Cu plates are roll-bonded (such as rolling reduction), or the like, which are used when manufacturing the heat spreader by a manufacturing method of the present invention described later.

Further, in order to set the variation in the thickness of the Cu—Mo layer to the above range, it is only necessary to adjust the variation in the thickness of the planarized plate material of the Cu—Mo composite material, the rolling conditions under which the plate material of the Cu—Mo composite material and the Cu plates are roll-bonded, or the like, which are used when manufacturing the heat spreader by the above manufacturing method.

It should be noted that, in the present invention, the average thickness and the variation in the thickness of the Cu—Mo layer are expressed by values measured by the following method.

Specifically, the heat spreader is cut in the thickness direction in any one direction within its plane, and is polished to expose a cross section. At any location of the Cu—Mo layer exposed in the cross section, a range of 3 mm in length in a direction orthogonal to the thickness direction is defined as one field of view, and ten fields of view are set on the same cross section. Within each field of view, positions at which the thickness of the Cu—Mo layer has the maximum value and the minimum value are specified using an optical microscope, and thereby a total of 20 positions are specified. Such an operation is performed on three cross sections separated by 120° in the plane direction of the heat spreader, in a total of 30 fields of view, to measure thicknesses at 60 positions. The average value of measured values of the thicknesses at these 60 positions is defined as the average thickness of the Cu—Mo layer. Further, the maximum value of absolute values of differences between the above average thickness and the measured values of the thicknesses at the 60 positions is defined as the variation in thickness.

<Other Characteristics>

The ratio of Cu in the Cu—Mo composite material constituting the Cu—Mo layer is preferably more than or equal to 22% by volume, and is preferably less than or equal to 56% by volume, of the total amount of the Cu—Mo composite material.

If the ratio of Cu is less than this range, the heat conductivity of the Cu—Mo layer is decreased. Thus, even though its thickness is set to less than or equal to 0.6 mm, it may not possible to achieve the effect of improving the heat conductivity of the heat spreader in the thickness direction more than that of an existing one, and removing heat from an element further efficiently and immediately.

In addition, the rate of Cu which exists in surfaces of the plate material of the Cu—Mo composite material constituting the Cu—Mo layer and functions as bonding points when the Cu plates are roll-bonded to the plate material is reduced. Thus, strength of bonding between the Cu—Mo layer and each Cu layer in the heat spreader manufactured by such roll-bonding may be reduced.

On the other hand, if the ratio of Cu is more than the above range, the thermal expansion coefficient of the Cu—Mo layer is increased, and the Cu—Mo layer's function of decreasing the thermal expansion coefficient of the entire heat spreader is not fully exhibited, causing an increase in the thermal expansion coefficient of the entire heat spreader. Accordingly, there is a possibility that, under a thermal load environment, an excessive stress is applied to the element or the like bonded to the element mounting surface, which tends to break the element or the like, the package, or the like, or to damage bonding.

The ratio of the thickness of the Cu—Mo layer to a total thickness of the heat spreader having a stacked structure is preferably more than or equal to 15%, and is preferably less than or equal to 35%.

If the ratio of the thickness of the Cu—Mo layer is less than this range, the Cu—Mo layer's function of decreasing the thermal expansion coefficient of the entire heat spreader is not fully exhibited, causing an increase in the thermal expansion coefficient of the entire heat spreader. Accordingly, there is a possibility that, under a thermal load environment, an excessive stress is applied to the element or the like bonded to the element mounting surface, which tends to break the element or the like, the package, or the like, or to damage bonding.

On the other hand, if the ratio of the thickness of the Cu—Mo layer is more than the above range, even though its thickness is set to less than or equal to 0.6 mm, it may not possible to achieve the effect of improving the heat conductivity of the heat spreader in the thickness direction more than that of an existing one, and removing heat from an element further efficiently and immediately.

In order to set the ratio of the thickness of the Cu—Mo layer to the above range, it is only necessary to adjust the thickness of the plate material of the Cu—Mo composite material constituting the Cu—Mo layer and the thickness of the Cu plates to be bonded thereto, the rolling conditions under which the plate material of the Cu—Mo composite material and the Cu plates are roll-bonded, or the like, in view of the range of the average thickness of the Cu—Mo layer described above.

Further, although the total thickness of the heat spreader including the Cu—Mo layer and the Cu layers can be arbitrarily set depending on the intended use or the like of the heat spreader, generally, it is preferably more than or equal to 0.4 mm, and is preferably less than or equal to 3 mm.

Preferably, the strength of bonding between the Cu—Mo layer and each Cu layer is more than or equal to 100 MPa, and is particularly more than or equal to 150 MPa.

If the strength of bonding between the Cu—Mo layer and each Cu layer is less than this range, interlayer peeling between the both layers is likely to occur under a thermal load environment, which may reduce the reliability of the heat spreader.

In order to set the strength of bonding between the Cu—Mo layer and each Cu layer to the above range, it is only necessary to adjust the ratio of Cu in the Cu—Mo composite material, or adjust the rolling conditions under which the plate material of the Cu—Mo composite material and the Cu plates are roll-bonded.

<Plating>

Preferably, plating is performed on an outermost surface of the heat spreader, that is, an exposed surface of at least one Cu layer on a side opposite to its Cu—Mo layer side.

Examples of preferable plating include electrolytic Ni plating, non-electrolytic Ni—P plating, non-electrolytic Ni—B plating, electrolytic Au plating, and a combination thereof.

By performing plating, solder wettability when another member such as an element is solder-bonded to the outermost surface can be improved.

<<Method for Manufacturing Heat Spreader>>

A method for manufacturing the heat spreader of the present invention is characterized by including the steps of planarizing a plate material of the Cu—Mo composite material constituting the Cu—Mo layer, and directly roll-bonding a Cu plate constituting the Cu layer to each of both surfaces of the planarized plate material.

<Fabrication of Cu—Mo Composite Material>

The Cu—Mo composite material can be formed by method (i) or (ii) described above, as with a conventional one. In particular, method (ii) as an infiltration method is preferable. The Cu—Mo composite material formed by the infiltration method has a continuous, integrated porous body (skeleton) made of Mo powder, and thus is excellent in the effect of decreasing the thermal expansion coefficient of the heat spreader.

(Formation of Porous Body)

In the infiltration method, first, Mo powder constituting the porous body (skeleton) is prepared.

Any of a variety of Mo powder manufactured by any method can be used as the Mo powder. In particular, such Mo powder preferably has an average particle size measured by the Fisher method (FSSS) of more than or equal to 1 μm and less than or equal to 10 μm.

Fine Mo powder having an average particle size of less than this range is difficult to fabricate, and may cause a reduction in the productivity of the Cu—Mo composite material, and thus of the heat spreader, and an increase in manufacturing cost.

On the other hand, in Mo powder having a large particle size whose average particle size is more than the above range, its particle size is further coarsened by particle growth during sintering, increasing variation of distribution of Cu and Mo in the Cu—Mo composite material and resulting positional variation of heat conductivity. Therefore, the above problem (1) may be likely to occur.

The above Mo powder is press-molded into a predetermined shape of the Cu—Mo composite material, for example using a press machine or the like, to fabricate a molded body, and thereafter the molded body is sintered for example in a non-oxidizing atmosphere such as hydrogen gas or in an inert atmosphere such as argon gas, to form a porous body.

It should be noted that the ratio of Cu in the Cu—Mo composite material fabricated by the infiltration method has a value close to the porosity of the porous body, and such a porosity can be adjusted by adjusting the molding density of the molded body constituting the porous body, and sintering conditions under which the molded body is sintered to fabricate the porous body (such as sintering temperature and sintering time).

For example, in order to set the ratio of Cu to more than or equal to 22% by volume and less than or equal to 56% by volume of the total amount of the Cu—Mo composite material as described above, it is only necessary for the porous body to have a porosity of more than or equal to 22% by volume and less than or equal to 56% by volume, and to have an apparent density, which is determined from the specific gravity of bulk Mo and the specific gravity of the air, of more than or equal to 4.8 g/cm$^3$ and less than or equal to 8.0 g/cm$^3$. For that purpose, it is preferable to set the molding density of the molded body molded by press molding to more than or equal to about 4.0 g/cm$^3$ and less than or equal to about 7.6 g/cm$^3$.

Further, in order to adjust the molding density to the above range, it is only necessary to adjust conditions for the press molding, the average particle size and the particle shape of the Mo powder, and the like.

The sintering temperature is preferably more than or equal to 1100° C., and is preferably less than or equal to 1600° C. In addition, the sintering time is preferably more than or equal to 0.5 hours, and is preferably less than or equal to 3 hours.

If any of the sintering temperature and the sintering time is less than the above range, sintering of the Mo powder is insufficient, and it is not possible to form a continuous porous body having the Mo powder sintered firmly. Accordingly, the effect of decreasing the thermal expansion coefficient of the heat spreader, which is obtained by the porous body, may not be able to be fully achieved.

On the other hand, if any of the sintering temperature and the sintering time is more than the above range, sintering of the Mo powder proceeds excessively, and independent pores (closed pores or voids) into which Cu is not infiltrated are formed in a portion of the porous body. As a result, the heat conductivity of the Cu—Mo composite material is decreased, or the variation thereof is increased, and thus the above problem (1) may be likely to occur.

Further, as a result of the formation of the above independent pores or the particle growth of the Mo powder during sintering, the porosity of the porous body, and thus the ratio of Cu in the Cu—Mo composite material, may be less than the range described above.

(Infiltration of Cu)

Next, Cu is infiltrated into the above porous body to fabricate a Cu—Mo composite material. Specifically, for example, as in a conventional method, the porous body having a Cu plate placed thereon, or the porous body sandwiched between two Cu plates, is heated to a temperature which is more than or equal to the melting point of Cu, for example in a non-oxidizing atmosphere such as hydrogen gas or in an inert atmosphere such as argon gas, to melt Cu and infiltrate the melted Cu into the porous body, and thereafter is cooled.

It is only necessary for the infiltration temperature to be more than or equal to the melting point of Cu as described above, and in particular the infiltration temperature is preferably more than or equal to 1300° C., and is preferably less than or equal to 1600° C. In addition, the infiltration time is preferably more than or equal to 0.5 hours, and is preferably less than or equal to 3 hours.

If any of the infiltration temperature and the infiltration time is less than the above range, it is not possible to fully infiltrate Cu into the porous body, and voids are generated. Accordingly, the heat conductivity of the Cu—Mo composite material is decreased, or the variation thereof is increased, and thus the above problem (1) may be likely to occur.

On the other hand, if any of the infiltration temperature and the infiltration time is more than the above range, this leads to excessive sintering and particle growth of the Mo powder which proceed even during the infiltration. As a result, the porosity of the porous body, and thus the ratio of Cu in the Cu—Mo composite material, may be less than the range described above.

Examples of preferable Cu to be infiltrated into the porous body include highly pure copper having a purity of 99.96% or more, oxygen-free copper, and the like, in view of imparting a high heat conductivity to the heat spreader.

Thereafter, extra Cu remaining on the surface of the porous body and the like is removed as necessary, and thereby a Cu—Mo composite body is fabricated.

<Fabrication of Plate Material>

Next, a plate material having a predetermined thickness is fabricated from the Cu—Mo composite material described above. For that purpose, it is preferable to perform the steps of, for example, warm-rolling the Cu—Mo composite material to have a predetermined thickness, cutting it into the shape of a plate and annealing it, thereafter further cold-rolling it to have a predetermined thickness, cutting it into the shape of a plate and annealing it, and the like.

By performing these steps, a plate material of a Cu—Mo porous body which is uniform and free from voids can be fabricated while providing intimate contact between the porous body made of Mo and Cu infiltrated into the porous body.

Both the warm rolling and the cold rolling may each be unidirectional rolling or cross rolling. The rolling may also be performed in three or more multiple directions.

The warm rolling temperature is preferably more than or equal to 120° C., and is preferably less than or equal to 200° C. Further, the annealing temperature is preferably more than or equal to 700° C., and is preferably less than or equal to 900° C. Furthermore, the annealing time is preferably more than or equal to 0.1 hours, and is preferably less than or equal to 0.5 hours.

<Planarization Treatment>

Next, the plate material of the Cu—Mo composite material described above is planarized. As a planarization treatment, any of a variety of planarization treatments including conventionally known polishing methods such as brush polishing and buffing, for example, can be adopted.

In such a planarization treatment, it is preferable to planarize the plate material such that the average thickness of the planarized plate material, the variation in thickness thereof, and the surface roughness of both surfaces of the plate material to which the Cu plates are to be roll-bonded satisfy the following ranges.

Specifically, the average thickness of the planarized plate material is preferably more than or equal to 0.5 mm, and is preferably less than or equal to 1.5 mm.

If the average thickness of the planarized plate material is less than this range, it is necessary to suppress a rolling reduction when the Cu layers are roll-bonded to the both surfaces of the above plate material in a subsequent step, in order to maintain the average thickness of the Cu—Mo layer in the heat spreader in the range described above. Thus, the strength of bonding between the Cu—Mo layer and each Cu layer falls below the range described above, and interlayer peeling between the both layers is likely to occur in particular under a thermal load environment, which may reduce the reliability of the heat spreader.

In addition, when the rolling reduction is low, a stacked body formed by roll-bonding the Cu plates on the both surfaces of the plate material cannot have a wide area. Accordingly, the number of heat spreaders obtained by being cut out from the stacked body is decreased, and the productivity of the heat spreader may be decreased.

On the other hand, if the average thickness of the planarized plate material is more than the above range, it is necessary on the contrary to increase the rolling reduction in the subsequent step. Although the plate material is planarized, the variation in the thickness of the Cu—Mo layer is increased, or the Cu—Mo layer becomes discontinuous. As a result, the heat conductivity of the heat spreader in the thickness direction varies in the plane direction, and thereby the above problem (1) may be likely to occur.

Further, the variation in the thickness of the planarized plate material is preferably less than or equal to 0.02 mm, and is particularly preferably less than or equal to 0.01 mm.

If the variation in the thickness of the planarized plate material is more than this range, the plate material ruptures when the Cu plates are roll-bonded thereto, and the Cu—Mo layer in the heat spreader becomes discontinuous. As a result, the heat conductivity of the heat spreader in the thickness direction varies in the plane direction, and thereby the above problem (1) may be likely to occur.

It should be noted that the variation in the thickness of the planarized plate material is preferably more than or equal to 0.005 mm in the above range.

As described above, since the Cu—Mo composite material is made of Cu and Mo, which are two materials completely different in hardness and workability, it is substantially difficult to planarize the plate material until the variation in thickness becomes less than the above range.

It should be noted that the average thickness of the plate material is expressed by an average value of thicknesses measured at any nine positions in a plane of such a plate material, using a micrometer or the like. Further, the variation in thickness is expressed by the maximum value of absolute values of differences between the above average thickness and the measured values of the thicknesses at the nine positions.

Furthermore, the surface roughness of the both surfaces of the planarized plate material to which the Cu plates are to be roll-bonded is preferably less than or equal to 0.02 μm, in particular less than or equal to 0.01 μm, in each surface, when expressed in an arithmetic average roughness Ra of a roughness curve defined in Japanese Industrial Standard JIS B0601$_{:2013}$ "Geometrical Product Specifications (GPS)—Surface texture: Profile method—Terms, definitions and surface texture parameters".

If the arithmetic average roughness Ra of the both surfaces of the plate material is more than this range, the plate material ruptures when the Cu plates are roll-bonded thereto, and the Cu—Mo layer in the heat spreader becomes discontinuous. As a result, the heat conductivity of the heat spreader in the thickness direction varies in the plane direction, and thereby the above problem (1) may be likely to occur.

It should be noted that the arithmetic average roughness Ra of the both surfaces of the plate material is preferably more than or equal to 0.005 μm in the above range.

As described above, since the Cu—Mo composite material is made of Cu and Mo, which are two materials completely different in hardness and workability, it is substantially difficult to planarize the plate material until the arithmetic average roughness Ra of the both surfaces becomes less than the above range.

It should be noted that an ordinary variation in the thickness of the plate material before the planarization treatment is about 0.04 mm. Further, an ordinary arithmetic average roughness Ra of the both surfaces of the plate material before the planarization treatment is about 0.1 μm.

<Roll-Bonding and Manufacturing of Heat Spreader>

A Cu plate having a predetermined thickness constituting the Cu layer is stacked on each of upper and lower surfaces of the planarized plate material, and in that state, they are hot-rolled and roll-bonded to each other for example in a non-oxidizing atmosphere such as hydrogen gas or in an inert atmosphere such as argon gas, until they have a predetermined thickness.

Thereafter, for example, copper oxide and the like formed on the surface are removed as necessary, and then the plate material and the Cu plates are annealed and further cold-rolled until they have a predetermined thickness, to obtain a stacked body including a Cu—Mo layer and two Cu layers. Thereafter, a heat spreader is cut out from the stacked body to have a predetermined planar shape, and plating is performed on an outermost surface thereof, as necessary. Consequently, the heat spreader of the present invention is manufactured.

The hot rolling temperature is preferably more than or equal to 850° C., and is preferably less than or equal to 1050° C.

Further, the rolling reduction in the hot rolling is preferably more than or equal to 5%, and is preferably less than or equal to 15%.

If the rolling reduction in the hot rolling is less than this range, unbonded portions are generated at interfaces between the Cu—Mo layer and the Cu layers, and the strength of bonding falls below the range described above. Thus, interlayer peeling between the both layers is likely to occur in particular under a thermal load environment, which may reduce the reliability of the heat spreader.

On the other hand, if the rolling reduction in the hot rolling is more than the above range, the plate material ruptures and the Cu—Mo layer in the heat spreader becomes discontinuous. As a result, the heat conductivity of the heat spreader in the thickness direction varies in the plane direction, and thereby the above problem (1) may be likely to occur.

The annealing temperature is preferably more than or equal to 700° C., and is preferably less than or equal to 900° C. In addition, the annealing time is preferably more than or equal to 0.1 hours, and is preferably less than or equal to 0.5 hours.

The rolling reduction in the cold rolling is set such that a total of the rolling reduction in the cold rolling and the rolling reduction in the hot rolling is preferably more than or equal to 37%, and is preferably less than or equal to 90%.

If the total rolling reduction is less than this range, the strength of bonding between the Cu—Mo layer and each Cu layer falls below the range described above, and interlayer peeling between the both layers is likely to occur in particular under a thermal load environment, which may reduce the reliability of the heat spreader. Further, since the stacked body cannot have a wide area, the number of heat spreaders obtained by being cut out from the stacked body is decreased, and the productivity of the heat spreader may be decreased.

On the other hand, if the total rolling reduction is more than this range, the plate material ruptures and the Cu—Mo layer in the heat spreader becomes discontinuous. As a result, the heat conductivity of the heat spreader in the thickness direction varies in the plane direction, and thereby the above problem (1) may be likely to occur.

Both the hot rolling and the cold rolling may each be unidirectional rolling or cross rolling. The rolling may also be performed in three or more multiple directions.

It should be noted that the heat spreader of the present invention and the method for manufacturing the same are not limited to the examples described above, and various modifications can be made thereto in a range not departing from the gist of the present invention.

EXAMPLES

Example 1

(Formation of Porous Body)

Mo powder having an average particle size measured by the Fisher method of 3.9 μm was press-molded at a molding pressure of 100 MPa using a press machine, to fabricate a molded body in the shape of a plate having dimensions of 143 mm×174 mm×14.3 mm. The molded body had a molding density of 5.2 g/cm$^3$.

Next, the molded body was sintered in a hydrogen atmosphere at 1000° C. for 1 hour using a firing furnace, to form a porous body. The porous body had an apparent density of 6.6 g/cm$^3$ and a porosity of 35.3% by volume.

(Fabrication of Cu—Mo Composite Body by Infiltrating Cu)

A Cu plate having a purity of 99.96% was placed on the above porous body, and they were heated in a hydrogen atmosphere at 1400° C. for 1 hour using the firing furnace, to infiltrate Cu into the porous body. Thereafter, extra Cu remaining on the surface of the porous body and the like was removed, to fabricate a Cu—Mo composite body having dimensions of 165 mm×131 mm×13 mm. The ratio of Cu was 32.9% by volume of the total amount of the Cu—Mo composite material.

(Fabrication of Plate Material)

The above Cu—Mo composite body was warm-rolled at 160° C. until it had a thickness of 1.6 mm, and then it was cut to have a length of 200 mm and a width of 155 mm, and was annealed at 850° C. for 0.3 hours.

Next, it was cold-rolled until it had a thickness of 0.85 mm, and then it was cut to have a length of 280 mm and a width of 190 mm, and was annealed at 850° C. for 0.3 hours, to fabricate a plate material of the Cu—Mo composite body.

The above plate material had a variation in thickness of 0.04 mm, and an arithmetic average roughness Ra of both surfaces thereof of 0.1 μm.

(Planarization Treatment)

The above plate material was planarized by brush polishing and buffing to have an average thickness of 0.80 mm, a variation in thickness of 0.01 mm, and an arithmetic average roughness Ra of the both surfaces of 0.01 μm.

(Roll-Bonding and Manufacturing of Heat Spreader)

A Cu plate having a purity of 99.96% and a thickness of 2.00 mm was stacked on each of upper and lower surfaces of the above planarized plate material, and in that state, they were hot-rolled and roll-bonded to each other in a hydrogen atmosphere at 940° C., until they had a thickness of 4.3 mm. The rolling reduction was 10.4%.

Next, copper oxide and the like formed on the surface were removed with a brush or the like. Then, the plate material and the Cu plates were annealed at 850° C. for 0.3 hours, and were further cold-rolled until they had a total thickness of 1.02 mm, to form a stacked body including a Cu—Mo layer and two Cu layers having a length of 1125 mm and a width of 190 mm. A heat spreader was manufactured by being cut out from the stacked body. The total rolling reduction was 78.8%.

(Average Thickness and Variation in Thickness)

FIG. 1 shows a micrograph of a cross section of the manufactured heat spreader. It can be seen from FIG. 1 that, in the heat spreader manufactured through the above steps, the variation in the thickness of the Cu—Mo layer was small, and the Cu—Mo layer and the Cu layers each had a substantially uniform thickness.

Further, the average thickness of the Cu—Mo layer determined by the aforementioned method from three cross sections including the cross section of FIG. 1 was 0.195 mm, and the variation in thickness was 0.06 mm. Furthermore, the average thicknesses of the two Cu layers determined by the same method were 0.412 mm and 0.409 mm.

(Tensile Test)

The manufactured heat spreader was cut out in the shape of a disk having a diameter of 15 mm, and, to each of front and rear surfaces thereof, a chromium-molybdenum steel having a diameter of 15 mm and a length of 70 mm was bonded with silver solder. Then, a tensile test was performed using a tensile tester. Rupture occurred at not interfaces between the Cu—Mo layer and the Cu layers but portions where the chromium-molybdenum steels were bonded with the silver solder. Therefore, it was found that the strength of bonding between the Cu—Mo layer and each Cu layer is more than the rupture strength of the portions bonded with the silver solder (170 MPa).

Comparative Example 1

A heat spreader was manufactured as in Example 1, except for using an unplanarized plate material of the Cu—Mo composite body having an average thickness of 0.80 mm, a variation in thickness of 0.04 mm, and an arithmetic average roughness Ra of the both surfaces thereof of 0.1 μm.

Figure 2:
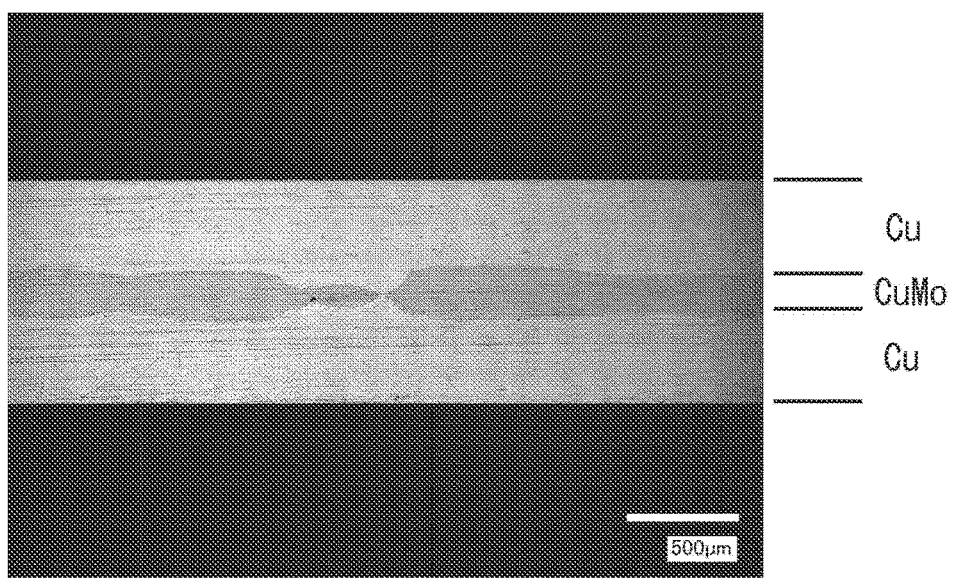
FIG. 2 is a micrograph showing a magnified cross section of a heat spreader manufactured in a comparative example of the present invention.

FIG. 2 shows a micrograph of a cross section of the manufactured heat spreader. It can be seen from FIG. 2 that, in the heat spreader manufactured without planarizing the plate material, the thickness of the Cu—Mo layer had a large variation and was not uniform, and the Cu—Mo layer partly became discontinuous.

Further, the average thickness of the Cu—Mo layer determined by the aforementioned method from three cross sections including the cross section of FIG. 2 was 0.184 mm, and the variation in thickness was 0.184 mm. Furthermore, the average thicknesses of the two Cu layers determined by the same method were 0.415 mm and 0.418 mm.

In addition, as a result of performing a tensile test as in Example 1, the strength of bonding was 165 MPa, although rupture occurred at interfaces between the Cu—Mo layer and the Cu layers.

Examples 2 to 8, Comparative Examples 2 and 3

Each heat spreader was manufactured as in Example 1, except for changing conditions for planarization treatment and setting the variation in the thickness of the planarized plate material and the arithmetic average roughness Ra of the both surfaces thereof to values shown in Table 1 or Table 2.

Examples 9 and 10

Each heat spreader was manufactured as in Example 1, except for setting the total thickness of the stacked body including a Cu—Mo layer and two Cu layers and the total rolling reduction in the hot rolling and the cold rolling to values shown in Table 1.

Examples 11 to 18, Comparative Example 4

Each heat spreader was manufactured as in Example 1, except for using Cu plates having thicknesses shown in Table 1 or Table 2, and setting the total thickness of the stacked body including a Cu—Mo layer and two Cu layers and the total rolling reduction in the hot rolling and the cold rolling to values shown in Table 1 or Table 2.

Examples 19 to 22

Each heat spreader was manufactured as in Example 1, except for using a Cu—Mo composite material having a ratio of Cu shown in Table 2.

Examples 23 and 24

Each heat spreader was manufactured as in Example 1, except for using a Cu—Mo composite material having a ratio of Cu shown in Table 2 and Cu plates having thicknesses shown in Table 2, and setting the total thickness of the stacked body including a Cu—Mo layer and two Cu layers and the total rolling reduction in the hot rolling and the cold rolling to values shown in Table 2.

Table 1 and Table 2 list the average thickness of the Cu—Mo layer, the variation in thickness thereof, the average thicknesses of the two Cu layers, the total thickness of the heat spreader, the ratio of the thickness of the Cu—Mo layer, the total rolling reduction in the hot rolling and the cold rolling, and the like determined by the aforementioned method in the heat spreader manufactured in each of the Examples and the Comparative Examples described above.

TABLE 1

| | Planarized Plate Material | | | | Cu Plate | | Heat Spreader | | | | | |
| | | | | | | | | | Cu Layer | | Cu—Mo Layer | | |
| | Ratio of Cu (Vol %) | Average Thickness (mm) | Variation in Thickness (mm) | Ra (μm) | Thickness (mm) | Thickness (mm) | Total Thickness (mm) | Total Rolling Reduction (%) | Average Thickness (mm) | Average Thickness (mm) | Average Thickness (mm) | Variation in Thickness (mm) | Ratio of Thickness (%) |
|---|---|---|---|---|---|---|---|---|---|---|---|---|---|
| Example 1 | 32.9 | 0.80 | 0.010 | 0.010 | 2.00 | 2.00 | 1.02 | 78.8 | 0.412 | 0.409 | 0.195 | 0.060 | 19.2 |
| Example 2 | 32.9 | 0.80 | 0.008 | 0.007 | 2.00 | 2.00 | 1.02 | 78.8 | 0.412 | 0.415 | 0.196 | 0.052 | 19.2 |
| Example 3 | 32.9 | 0.80 | 0.005 | 0.005 | 2.00 | 2.00 | 1.02 | 78.8 | 0.410 | 0.413 | 0.194 | 0.032 | 19.1 |
| Example 4 | 32.9 | 0.80 | 0.010 | 0.015 | 2.00 | 2.00 | 1.03 | 78.5 | 0.413 | 0.416 | 0.197 | 0.075 | 19.2 |
| Example 5 | 32.9 | 0.80 | 0.010 | 0.020 | 2.00 | 2.00 | 1.02 | 78.8 | 0.412 | 0.416 | 0.194 | 0.080 | 19.0 |
| Example 6 | 32.9 | 0.80 | 0.015 | 0.010 | 2.00 | 2.00 | 1.02 | 78.8 | 0.413 | 0.415 | 0.192 | 0.084 | 18.8 |
| Example 7 | 32.9 | 0.80 | 0.020 | 0.010 | 2.00 | 2.00 | 1.02 | 78.8 | 0.410 | 0.412 | 0.194 | 0.095 | 19.1 |
| Example 8 | 32.9 | 0.80 | 0.020 | 0.020 | 2.00 | 2.00 | 1.02 | 78.8 | 0.416 | 0.413 | 0.195 | 0.098 | 19.0 |
| Example 9 | 32.9 | 0.80 | 0.010 | 0.010 | 2.00 | 2.00 | 0.70 | 85.4 | 0.287 | 0.285 | 0.130 | 0.059 | 18.5 |
| Example 10 | 32.9 | 0.80 | 0.010 | 0.010 | 2.00 | 2.00 | 2.99 | 37.7 | 1.210 | 1.213 | 0.570 | 0.049 | 19.0 |
| Example 11 | 32.9 | 0.80 | 0.010 | 0.010 | 2.60 | 2.60 | 1.03 | 82.8 | 0.435 | 0.433 | 0.159 | 0.055 | 15.5 |
| Example 12 | 32.9 | 0.80 | 0.010 | 0.010 | 1.40 | 1.40 | 1.01 | 71.9 | 0.376 | 0.378 | 0.251 | 0.045 | 25.0 |
| Example 13 | 32.9 | 0.50 | 0.010 | 0.010 | 1.40 | 1.40 | 0.70 | 78.8 | 0.290 | 0.291 | 0.121 | 0.032 | 17.2 |
| Example 14 | 32.9 | 0.50 | 0.020 | 0.020 | 1.40 | 1.40 | 0.70 | 78.8 | 0.292 | 0.289 | 0.122 | 0.061 | 17.4 |

TABLE 2

| | Planarized Plate Material | | | | Cu Plate | | Heat Spreader | | | | | |
| | | | | | | | | | Cu Layer | | Cu—Mo Layer | | |
| | Ratio of Cu (Vol %) | Average Thickness (mm) | Variation in Thickness (mm) | Ra (μm) | Thickness (mm) | Thickness (mm) | Total Thickness (mm) | Total Rolling Reduction (%) | Average Thickness (mm) | Average Thickness (mm) | Average Thickness (mm) | Variation in Thickness (mm) | Ratio of Thickness (%) |
|---|---|---|---|---|---|---|---|---|---|---|---|---|---|
| Example 15 | 32.9 | 1.20 | 0.010 | 0.010 | 2.80 | 2.80 | 2.00 | 70.6 | 0.798 | 0.799 | 0.405 | 0.041 | 20.2 |
| Example 16 | 32.9 | 1.20 | 0.020 | 0.020 | 2.80 | 2.80 | 1.99 | 70.7 | 0.795 | 0.791 | 0.402 | 0.068 | 20.2 |
| Example 17 | 32.9 | 1.50 | 0.010 | 0.010 | 3.50 | 3.50 | 2.99 | 64.8 | 1.196 | 1.198 | 0.599 | 0.032 | 20.0 |
| Example 18 | 32.9 | 1.50 | 0.020 | 0.020 | 3.50 | 3.50 | 2.99 | 64.8 | 1.197 | 1.196 | 0.598 | 0.063 | 20.0 |
| Example 19 | 22.0 | 0.80 | 0.010 | 0.010 | 2.00 | 2.00 | 1.01 | 79.0 | 0.413 | 0.410 | 0.191 | 0.058 | 18.8 |
| Example 20 | 22.0 | 0.80 | 0.020 | 0.020 | 2.00 | 2.00 | 1.01 | 79.0 | 0.410 | 0.409 | 0.189 | 0.092 | 18.8 |
| Example 21 | 43.0 | 0.80 | 0.010 | 0.010 | 2.00 | 2.00 | 1.02 | 78.8 | 0.413 | 0.412 | 0.197 | 0.043 | 19.3 |
| Example 22 | 43.0 | 0.80 | 0.020 | 0.020 | 2.00 | 2.00 | 1.03 | 78.5 | 0.413 | 0.415 | 0.198 | 0.066 | 19.3 |
| Example 23 | 56.0 | 1.00 | 0.010 | 0.010 | 1.20 | 1.20 | 0.40 | 88.2 | 0.135 | 0.134 | 0.134 | 0.031 | 33.3 |
| Example 24 | 56.0 | 1.00 | 0.020 | 0.020 | 1.20 | 1.20 | 0.40 | 88.2 | 0.136 | 0.133 | 0.135 | 0.061 | 33.4 |
| Comparative Example 1 | 32.9 | 0.80 | 0.040 | 0.100 | 2.00 | 2.00 | 1.02 | 78.8 | 0.415 | 0.418 | 0.184 | 0.184 | 18.1 |
| Comparative Example 2 | 32.9 | 0.80 | 0.010 | 0.028 | 2.00 | 2.00 | 1.01 | 79.0 | 0.408 | 0.413 | 0.192 | 0.152 | 19.0 |
| Comparative Example 3 | 32.9 | 0.80 | 0.028 | 0.010 | 2.00 | 2.00 | 1.01 | 79.0 | 0.407 | 0.413 | 0.193 | 0.165 | 19.1 |
| Comparative Example 4 | 32.9 | 0.80 | 0.010 | 0.010 | 2.60 | 2.60 | 0.70 | 88.3 | 0.301 | 0.298 | 0.102 | 0.102 | 14.6 |

The results of the Examples and the Comparative Examples in the both tables have revealed that, in order to set the average thickness of the Cu—Mo layer of the heat spreader to less than or equal to 0.6 mm and to set the variation in thickness to less than or equal to 0.1 mm, it is preferable to plaranize the plate material of the Cu—Mo composite material constituting the Cu—Mo layer to have an average thickness of more than or equal to 0.5 mm and less than or equal to 1.5 mm, a variation in thickness of less than or equal to 0.02 mm, and an arithmetic average roughness Ra of each of the both surfaces of less than or equal to 0.02 µm.

The invention claimed is:

1. A heat spreader, comprising:
    a Cu—Mo layer made of a Cu—Mo composite material and having an average thickness of less than or equal to 0.6 mm and a variation in thickness of less than or equal to 0.1 mm; and
    a Cu layer directly stacked on each of both surfaces of the Cu—Mo layer,
    wherein a strength of bonding between the Cu—Mo layer and each of the Cu layers is more than or equal to 150 MPa.

2. The heat spreader according to claim 1, wherein the Cu—Mo layer and the Cu layer on each of the both surfaces thereof are directly roll-bonded to each other.

3. The heat spreader according to claim 1, wherein the Cu—Mo layer has an average thickness of more than or equal to 0.12 mm and less than or equal to 0.6 mm.

4. The heat spreader according to claim 1, wherein the Cu—Mo layer has a variation in thickness of more than or equal to 0.03 mm and less than or equal to 0.06 mm.

5. The heat spreader according to claim 1, wherein a ratio of the thickness of the Cu—Mo layer to a total thickness of the heat spreader is more than or equal to 15% and less than or equal to 35%.

6. The heat spreader according to claim 1, wherein plating is performed on an outermost surface.

* * * * *